United States Patent
Zhang et al.

(10) Patent No.: US 9,874,590 B2
(45) Date of Patent: Jan. 23, 2018

(54) TEST PLATFORM FOR HIGH-FREQUENCY CABLE

(71) Applicants: SHANGHAI ELECTRIC CABLE RESEARCH INSTITUTE, Shanghai (CN); SHANGHAI SECRI OPTICAL & ELECTRIC CABLE CO., LTD., Shanghai (CN)

(72) Inventors: Cheng Zhang, Shanghai (CN); Bin Jiang, Shanghai (CN); Nallian Shen, Shanghai (CN); Jiangjiang Gong, Shanghai (CN); Ying Yin, Shanghai (CN)

(73) Assignees: SHANGHAI ELECTRIC CABLE RESEARCH INSTITUTE, Yang Pu, Shanghai (CN); SHANGHAI SECRI OPTICAL & ELECTRIC CABLE CO., LTD., Yang Pu, Shanghai (CN)

( * ) Notice: Subject to any disclaimer, the term of this patent is extended or adjusted under 35 U.S.C. 154(b) by 0 days.

(21) Appl. No.: 15/125,311

(22) PCT Filed: Dec. 31, 2014

(86) PCT No.: PCT/CN2014/095898
§ 371 (c)(1),
(2) Date: Sep. 12, 2016

(87) PCT Pub. No.: WO2016/065723
PCT Pub. Date: May 6, 2016

(65) Prior Publication Data
US 2017/0219644 A1    Aug. 3, 2017

(30) Foreign Application Priority Data
Oct. 30, 2014    (CN) .......................... 2014 1 0603883

(51) Int. Cl.
*G01R 31/02*    (2006.01)
*G01R 1/04*    (2006.01)

(52) U.S. Cl.
CPC ......... *G01R 31/021* (2013.01); *G01R 1/0416* (2013.01)

(58) Field of Classification Search
CPC ..... G01R 1/06772; H01R 9/05; H01B 7/0216
See application file for complete search history.

(56) References Cited

U.S. PATENT DOCUMENTS

| | | | |
|---|---|---|---|
| 6,710,604 B2 | 3/2004 | Christopherson et al. | |
| 2004/0042137 A1* | 3/2004 | Wong ................... | H02H 1/0015 |
| | | | 361/42 |

(Continued)

FOREIGN PATENT DOCUMENTS

| CN | 2709992 Y | 7/2005 |
|---|---|---|
| CN | 101676732 A | 3/2010 |

(Continued)

*Primary Examiner* — Giovanni Astacio-Oquendo
*Assistant Examiner* — Alvaro Fortich
(74) *Attorney, Agent, or Firm* — Global IP Services; Tianhua Gu

(57) ABSTRACT

The present invention discloses a test platform for high-frequency cable, comprising conductive contacts and clamps for pressing a conductor of the cable on the conductive contact, and comprising a splitter seat, which comprises a top surface and a plurality of varied sides, the conductive contacts are respectively arranged on the sides, the clamps are arranged at a peripheral of the splitter seat and is opposite to the conductive contact, the splitter seat is further provided with a splitter channel, and the splitter channel slantingly connects the top surface to the sides. The present invention adopts a splitter seat with a polyhedral structure, which may shorten the stripped length, and prevent for vertically bending the core, thereby reducing the damage to (Continued)

the cable structure to the greatest extent, and greatly increasing the test frequency.

8 Claims, 4 Drawing Sheets

(56) References Cited

U.S. PATENT DOCUMENTS

| | | | |
|---|---|---|---|
| 2008/0073105 A1* | 3/2008 | Clark | H01B 7/0216 174/112 |
| 2015/0136219 A1* | 5/2015 | Koike | H01L 31/022425 136/256 |

FOREIGN PATENT DOCUMENTS

| | | |
|---|---|---|
| CN | 203705487 U | 7/2014 |
| JP | 3749943 B2 | 3/2006 |
| WO | WO 9527905 | 10/1995 |

\* cited by examiner

– 1 –
TEST PLATFORM FOR HIGH-FREQUENCY CABLE

CROSS REFERENCE TO RELATED PATENT APPLICATION

The present application is the US national stage of PCT/CN2014/095898 filed on Dec. 31, 2014, which claims the priority of the Chinese patent application No. 2014106038835 filed on Oct. 30, 2014, which applications are incorporated herein by reference.

BACKGROUND OF THE PRESENT INVENTION

Field of Invention

The present invention relates to a cable test system, and particularly relates to a test platform for a high-frequency cable.

Description of Related Arts

Generally, a cable contains several pairs of cores, when performing cable test, it is required to strip the cable to expose a conductor of each core at the end, then those cores are accessed to the cable test system via a connection apparatus to perform the test. The higher the test frequency is, the shorter the required stripped length of the cable is, as well as the higher the requirement for the integrity of the cable structure itself is. As such, when performing high frequency test, advanced requirement is presented on the test platform for the high-frequency cable.

Conventional symmetric data cable tests are mainly concentrated at lower bands (mainly 1~350 MHz, 1~750 MHz). As for high band test, test is either performed on a pair of core each time, or simultaneously performed on multiple pairs of cores at a relative low frequency, wherein, for the former one, the mutual crosstalk among multiple pairs of cores fails to test in this way; and for the latter one, when simultaneously testing the multiple pairs of cores, complete test data is still unachievable, because outer cladding of the symmetric data cable is excessively broken by the wiring process.

A Chinese utility model patent, CN2709992Y, has disclosed a cable test platform, which comprises a plurality of wiring clamps arranged along a circular arc; after the cable to be test is stripped, each core is diverged in the form of a fan in a same plane, and is inserted with each wiring clamp along the radial direction of the circular arc, to complete the wiring. Due to the restriction of the wiring clamp structure, the distance between the two adjacent wiring clamps is impossible to be relatively small, with the result of the impossible relatively small of the radius of the circular arc, i.e., the stripped length of the cable is impossible to be relatively short. As such, the test frequency of the cable is restricted, and generally, as for the cable test platform of such structure, the test frequency thereof may not exceed 1 GHz.

A Chinese patent application, 200810200066.X, has disclosed a high-frequency patch board of a cable test system, which comprises a plurality of clamps evenly distributed on the disc body of the high-frequency wiring board in the peripheral direction, the cable to be tested is inserted from the center of the disc body in the direction perpendicular to the disc body surface, to vertically bend each core, such that all the cores are radially distributed in a same plane, and are inserted into each clamp along the radius directions, to complete the wiring. Such structure may shorten the stripped length of the cable, however, since the core is vertically bended, the damage to the cable structure is relative large, and thus the test frequency thereof is just about 1.2 GHz.

In view of foregoing, regarding to the cable test system in the prior art, since all the cores are arranged in a same plane for testing, the damage to the cable structure is relative large, and thus it may not meet the test requirement of higher frequency.

SUMMARY OF THE PRESENT INVENTION

The technical problem to be solved in the present invention is to provide a test platform for a high-frequency cable, so as to reduce the damage to the cable structure, and to meet the test requirement of higher frequency.

In order to solve the above technical problem, the present invention adopts the following technical solution: a test platform for a high-frequency cable, comprising conductive contacts and clamps for pressing a conductor of the cable against the conductive contact, and further comprising a splitter seat, which comprises a top surface and a plurality of sides, the conductive contacts are respectively arranged on the sides, the clamps are arranged at a peripheral of the splitter seat and are opposite to the conductive contacts, the splitter seat is further provided with splitter channels, and the splitter channels slantingly connect the top surface to the sides.

Preferably, the conductive contact is arranged below the top surface of the splitter seat, the splitter channel is slanted outwardly and downwardly from the top surface.

Preferably, the top surface of the splitter seat is a regular polygon, and an inscribed circle of the regular polygon has a diameter smaller than that of the cable.

Preferably, each side of the splitter seat is vertical to the top surface respectively.

Preferably, each side of the splitter seat is a slope face respectively, and the inclination direction of each side is corresponding with that of each splitter channel.

Preferably, the splitter seat is covered by a shielding case there above, and the centre of the shielding case is provided with a through-hole into which the cable penetrates.

Preferably, the clamp comprises a fixing seat and a line-glide slider slidable in the fixing seat, a front end of the slider is provided with a clamping face opposite to the conductive contact, a rear end of the slider is hingedly connected to a front end of a link via a first hinge point, the rear end of the link is hingedly connected to a middle part of a strut via a second hinge point, and a lower end of the strut is hingedly connected to the fixing seat via a third hinge point.

More preferably, when the clamp presses the conductor of the cable against the conductive contact, the first, second and third hinge points are positioned in a same straight line.

As comparing to the prior art, the present invention has significant beneficial effects that: firstly, the present invention adopts a splitter seat with a polyhedral structure, which may allocate the plurality pairs of cores to be tested to each side of the splitter seat to connect with the cable test system, for simultaneously performing test on the plurality pairs of cores; secondly, since each pair of cores is located at a different side of the splitter seat, as such, each pair of cores keeps a relative focus state on the splitter seat, and each clamp may still have sufficient arrangement space in the periphery of the splitter seat, with the result that, during the wiring in the present invention, there is no need for a very long stripped length, and the shortening of the stripped length is beneficial for the improvement of the test frequency; thirdly and particularly advantageously, an inclined splitter channel is provided between the top surface and side of the splitter seat of the present invention, which may shorten the stripped length on one hand, and prevent vertically bending the core on the other hand, as a result, the present invention may reduce the damage to the cable structure to the greatest extent during wiring, and greatly increase the test frequency, e.g., the present invention may increase the cable test frequency above 2.4 GHz.

DETAILED DESCRIPTION OF THE PREFERRED EMBODIMENTS

Hereinafter, the detailed description of the present invention will be illustrated in details with reference to figures. Those embodiments are merely used to describe the present invention, but not to limit the invention.

In the description of the invention, it should be noted that, the indicated orientation or positional relationship, e.g., terms of "center", "upper", "lower", "vertical", "horizontal", "top", "bottom", "inner", "outer", etc., are based on the indicated orientation or positional relationship as shown in figures, and are merely used for ease of description and simplicity, but not for indicating or implying the specific orientation of the device or means meant to be, or the specific configured orientation and operation, and thus should not be construed as the limitation of the present invention. In addition, the ordinal numbers of "first", "second", etc., are merely used for ease of description, and should not be construed to indicate or imply the relative significance. In the description of the invention, unless otherwise mentioned, "a plurality of" means two or more than two.

Figure 1:
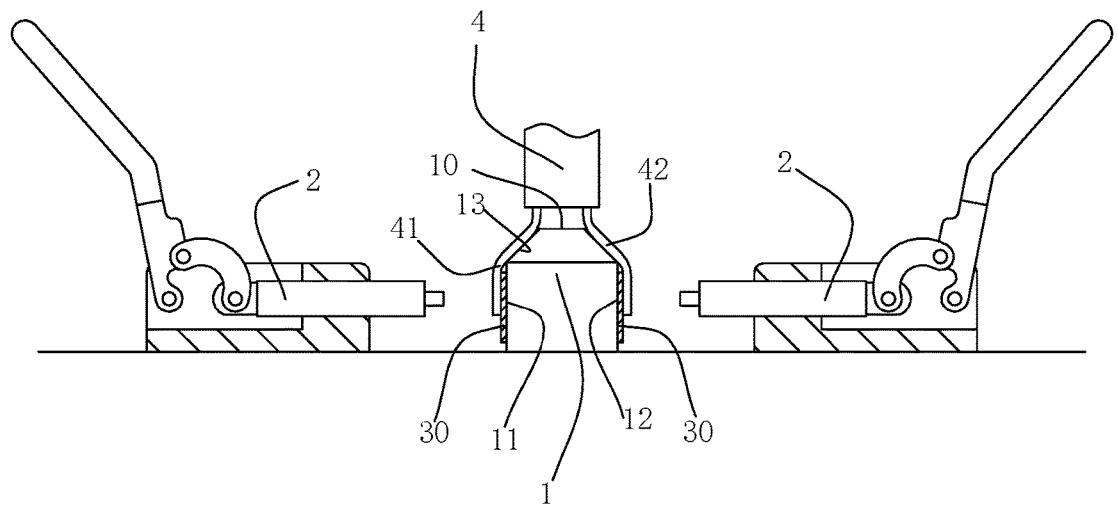
FIG. 1 is a structural diagram of the first embodiment of a test platform for a high-frequency cable of the present invention.

As shown in FIG. 1, a test platform for a high-frequency cable of the present invention comprises a splitter seat 1, which comprises a top surface 10 and a plurality of varied sides 11, 12, the top surface 10 of the present embodiment is a horizontal plane, and the sides 11, 12 are vertical planes that are vertical to the top surface, and the splitter seat 1 is further provided with splitter channels 13, which are slantingly connected with the top surface 10 and each side 11, 12. Each side 11, 12 is provided with a conductive contact 30, respectively, and the splitter seat 1 is provided with a plurality of clamps 2 opposite to the conductive contacts 30 in the periphery.

Since the conductive contacts are placed on sides 11, 12, and below the top surface 10 of the splitter seat, each splitter channel 13 is inclined outwardly and downwardly from the top surface 10.

Before wiring, 20 mm of a outer protective jacket and a shielding layer at one end of the cable to be tested is stripped, to expose cores 41, 42, which are generally in pair, i.e., the core 41 contains a wire twisted by two wires together, and the core 42 contains a wire twisted by two wires together, then an insulating layer of the end of the core 41, 42 are stripped, to expose the conductor.

As shown in FIG. 1, during wiring, the stripped cable to be tested 4 is inserted into the test platform along the direction vertical to the top surface 10 of the splitter seat, to separate the cores, such that each pair of cores 41, 42 is located within a splitter channel 13 respectively, and extends downwardly along the splitter channel 13 to each side 11, 12. It can be seen that, in the present embodiment, due to the existence of the splitter channel 13, each pair of cores 41, 42 may engage its rear end with each side 11, 12, via two relative gradual bend, such connection mode features relatively small damage to the cable structure itself. As the clamps 2 are used to press the conductor exposed at the rear end of each core against the conductive contact 30, to form an electric connection, and as two ends of the cable to be tested 4 are connected with each pair of core, it enables to be tested by the cable test system. In order to avoid interference from outside signals, the splitter seat 1 may be covered by a shielding case 6 there above (as shown in FIG. 2), and the centre of the shielding case 6 is provided with a through-hole 60 into which the cable penetrates.

Figure 2:
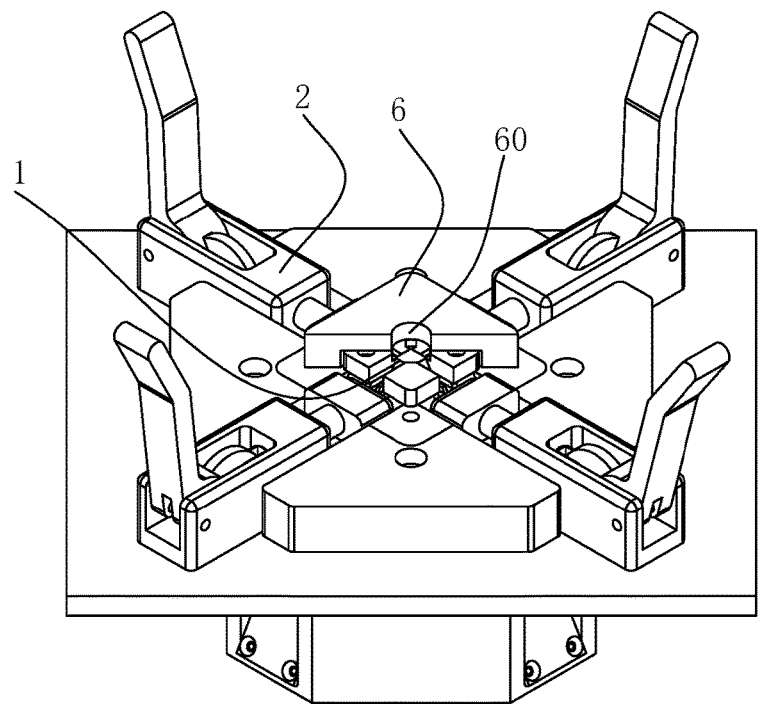
FIG. 2 is a perspective diagram of a test platform with four clamps of the present invention.
Figure 4:
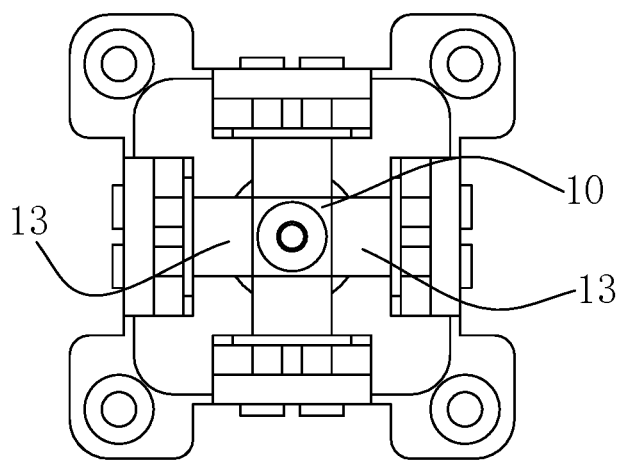
FIG. 4 is a top view of a splitter seat of the first embodiment of the present invention.

As shown in FIGS. 2 and 4, as the cable to be tested contains four pairs of cores, the top surface 10 of the splitter seat is a square, and the four lines of the square are downwardly extended with four splitter channels 13, and lower parts of the four splitter channels 13 are connected with the four sides, such that the four pairs of cores are symmetrically allocated to the four sides of the splitter seat along the four splitter channels 13. As the cable to be tested contains N pairs of cores, the top surface 10 of the splitter seat is a regular polygon with N sides, and the number of the sides 11, 12 and the splitter channel 13 are also N. In order to shorten the stripped length of the cable, it is preferred that an inscribed circle of the regular polygon constituting the top surface 10 has a diameter smaller than that of the cable.

Figure 3:
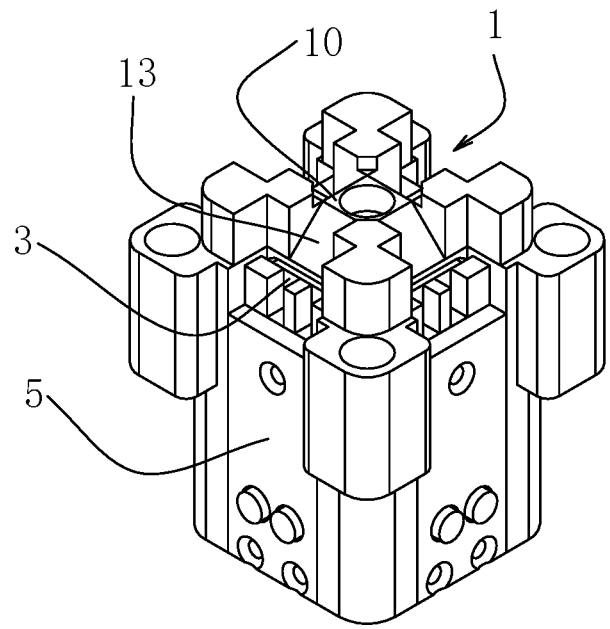
FIG. 3 is a perspective view of a splitter seat of the first embodiment of the present invention.

As shown in FIG. 3, each side of the splitter seat 1 is fixed with a circuit board 3, the above conductive contacts are arranged on the circuit board 3, and the outside of the circuit board 3 is shielded by shield board 5.

Figure 5:
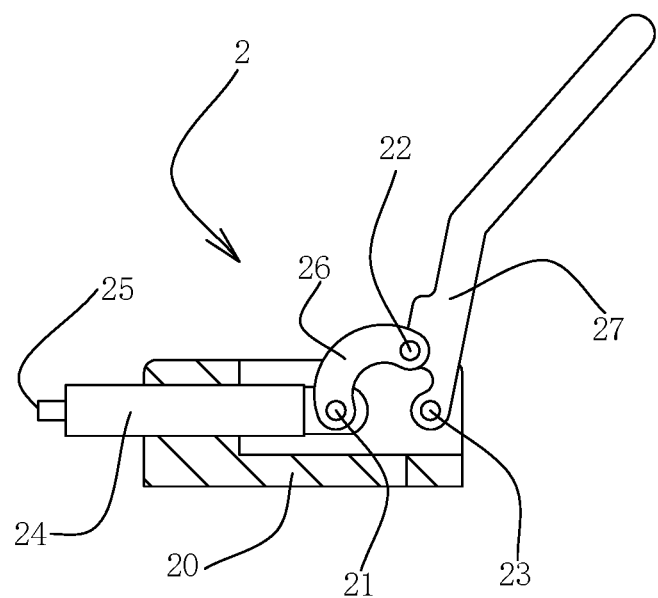
FIG. 5 is a structural diagram of the clamp of the present invention.
Figure 6:
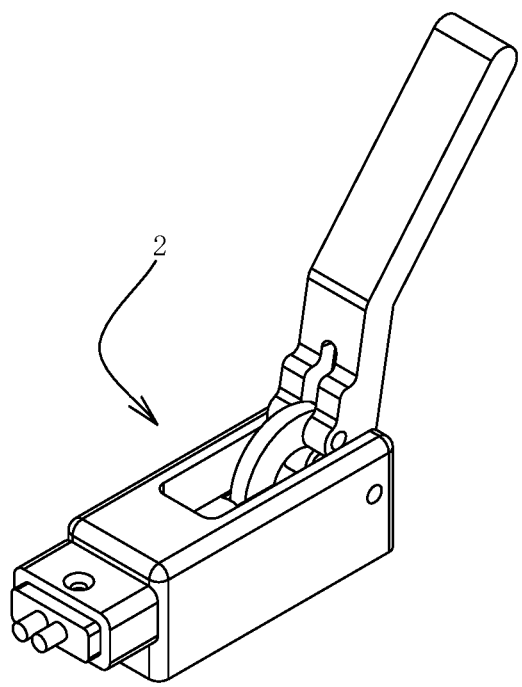
FIG. 6 is a perspective view of the clamp of the present invention.

The clamp 2 acts for pressing the conductor exposed at the rear end of each core against the conductive contact, and there are many ways to achieve such pressing function for those skilled in the art. The present invention further provides a preferable structure of the clamp 2, as shown in FIGS. 5 and 6, the clamp 2 comprises a fixing seat 20 and a line-glide slider 24 slidable in the fixing seat, a front end of the slider 24 is provided with a clamping face 25 opposite to the conductive contact, a rear end of the slider 24 is hingedly connected to a front end of a link 26 via a first hinge point 21, the rear end of the link 26 is hingedly connected to a middle part of a strut 27 via a second hinge point 22, and a lower end of the strut 27 is hingedly connected to the fixing seat 20 via a third hinge point 23. When manually pushing an upper end of a strut 27 to move forward, the slider 24 may be driven to move forward as well, so that the conductor exposed at the rear end of each core is pressed against the conductive contact. Such clamp is very simple and efficient in operation. More preferably, when the clamp 2 presses the conductor of the cable against the conductive contact, the first hinge point 21, second hinge point 22 and third hinge point 23 are located exactly in a same straight line, by which self-lock is achievable, and the clamp is held without loosening.

Figure 7:
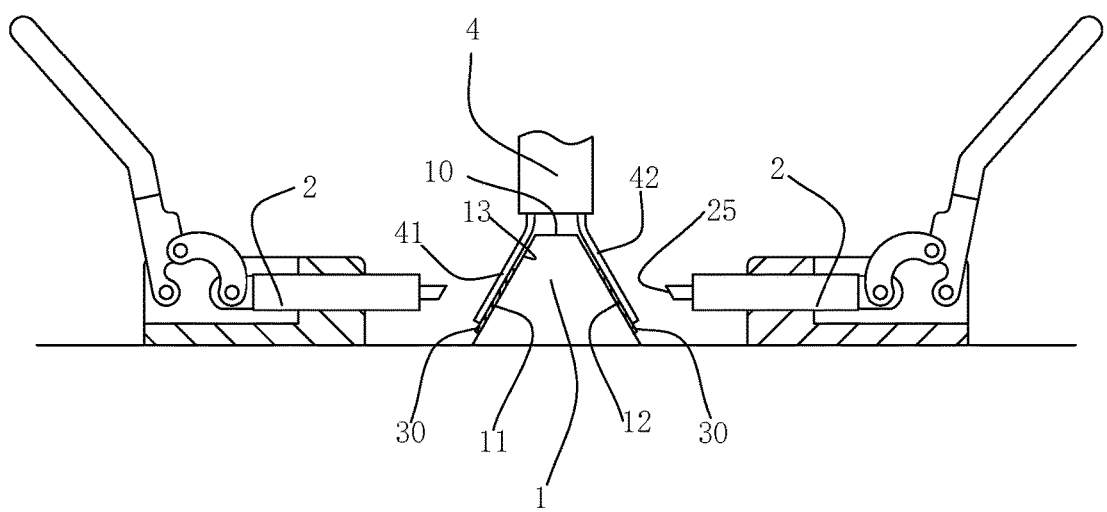
FIG. 7 is a structural diagram of the second embodiment of a test platform of the present invention.

FIG. 7 is shown to a structural diagram of a second embodiment of a test platform for a high-frequency cable of the present invention, unlike the structure as shown in FIG. 1, in the present embodiment, each side 11, 12 of the splitter seat 1 is a slope face respectively, and each side 11, 12 features an inclination direction corresponded with that of each splitter channel 13, and extends downwardly from the lower end of each splitter channel 13, As such, cores 41, 42 extend from the splitter channel 13 to each side 11, 12, without the need of bend. Therefore, each pair of cores 41, 42 just need one bend when entering the splitter channel 13, by which the damage to the cable structure can be further reduced and the stripped length is shortened. In order to better press the conductor of the cable against the sloped face, a presser face 25 at the front end of each clamp 2 is also configured as a sloped face. The other structure is same to the first embodiment as shown in FIG. 1.

The above are preferable exemplary manners of the present invention, it is to be noted that, for those skilled in the art, without departing from the technical principle of the present invention, several improvements or substitutions also may be made, which also should be deemed within the protective scope of the present invention.

What is claimed is:

1. A test platform for high-frequency cable, comprising conductive contacts (30) and clamps (2) for pressing a conductor of the cable against the conductive contact (30), characterized in that, the test platform further comprises a splitter seat (1), which comprises a top surface (10) and a plurality of varied sides (11, 12), the conductive contacts (30) are respectively arranged on the sides (11, 12), the clamps (2) is arranged at a peripheral of the splitter seat (1) and is opposite to the conductive contact (30), the splitter seat (1) is further provided with a splitter channel (13), and the splitter channel (13) slantingly connects the top surface (10) to the sides (11, 12).

2. The test platform according to claim 1, characterized in that, the conductive contact (30) is arranged below the top surface (10) of the splitter seat, the splitter channel (13) is inclined outward and downwardly from the top surface (10).

3. The test platform according to claim 1, characterized in that, the top surface (10) of the splitter seat is a regular polygon, and an inscribed circle of the regular polygon has a diameter smaller than that of the cable.

4. The test platform according to claim 1, characterized in that, each side (11, 12) of the splitter seat (1) is vertical with the top surface (10) respectively.

5. The test platform according to claim 1, characterized in that, each side (11, 12) of the splitter seat (1) is a slope face respectively, and the inclination direction of each side (11, 12) is corresponding with that of each splitter channel (13).

6. The test platform according to claim 1, characterized in that, the splitter seat (1) is covered by a shielding case (6) there above, and a centre of the shielding case (6) is provided with a through-hole (60) into which the cable penetrates.

7. The test platform according to claim 1, characterized in that, the clamp (2) comprises a fixing seat (20) and a line-glide slider (24) slidable in the fixing seat (20), a front end of the slider (24) is provided with a clamping face (25) opposite to the conductive contact (30), a rear end of the slider (24) is hingedly connected to a front end of a link (26) via a first hinge point (21), a rear end of the link (26) is hingedly connected to a middle part of a strut (27) via a second hinge point (22), and a lower end of the strut (27) is hingedly connected to the fixing seat (20) via a third hinge point (23).

8. The test platform according to claim 7, characterized in that, when the clamp (2) presses the conductor of the cable against the conductive contact (30), the first hinge point (21), the second hinge point (22) and the third hinge points (23) are positioned in a same straight line.

* * * * *